(12) United States Patent
Apelsmeier et al.

(10) Patent No.: US 10,784,180 B2
(45) Date of Patent: Sep. 22, 2020

(54) ELECTRONICS DEVICE HAVING AT LEAST ONE COMPONENT TO BE COOLED

(71) Applicant: AUDI AG, Ingolstadt (DE)

(72) Inventors: Andreas Apelsmeier, Pollenfeld (DE); Benjamin Söhnle, Ingolstadt (DE); Stephan Brüske, Kiel (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/992,469

(22) Filed: May 30, 2018

(65) Prior Publication Data
US 2019/0027420 A1 Jan. 24, 2019

(30) Foreign Application Priority Data
Jul. 20, 2017 (DE) .......................... 10 2017 212 434

(51) Int. Cl.
*H01L 23/367* (2006.01)
*G01R 15/20* (2006.01)
(Continued)

(52) U.S. Cl.
CPC ........ *H01L 23/3675* (2013.01); *G01R 15/202* (2013.01); *G01R 15/207* (2013.01); *H01L 23/5386* (2013.01); *H01L 25/072* (2013.01); *B60R 16/03* (2013.01); *G01R 31/006* (2013.01); *H01L 23/055* (2013.01); *H01L 23/36* (2013.01); *H02M 7/003* (2013.01)

(58) Field of Classification Search
CPC ..... H01L 23/2675; H01L 43/04; H01L 43/06; H01L 43/065; H01L 23/34–4735; H01L 23/053–057; H01L 2023/4043; H01L 43/00–14; G01R 15/202; G01R 33/077; G01R 19/00; G01R 33/07–077; G01R 14/202; H02P 29/685; H04Q 2213/307; H03M 2201/8184; G01D 5/142–147
See application file for complete search history.

(56) References Cited

U.S. PATENT DOCUMENTS 6,611,137 B2   8/2003   Haensgen et al.
2005/0206357 A1*  9/2005  Laurent ............... B60R 16/0239
                                                    323/282
(Continued)

FOREIGN PATENT DOCUMENTS

CN    104053998 A    9/2014
CN    106340493 A    1/2017
(Continued)

OTHER PUBLICATIONS

Examination Report dated Mar. 15, 2018 of corresponding German application No. 10 2017 212 434.2; 7 pgs.
(Continued)

*Primary Examiner* — Eric A. Ward
*Assistant Examiner* — Eric K Ashbahian
(74) *Attorney, Agent, or Firm* — Maier & Maier, PLLC

(57) ABSTRACT

An electronics device with at least one component to be cooled, a cooling element for cooling the component to be cooled, at least one power supply line, and a respective current sensor for recording a current strength of a current flowing through the respective power supply line, wherein the cooling element has a recess, in which the current sensor engages or in which the current sensor is arranged.

6 Claims, 2 Drawing Sheets

(51) Int. Cl.
  *H01L 23/538* (2006.01)
  *H01L 25/07* (2006.01)
  *H01L 23/055* (2006.01)
  *H01L 23/36* (2006.01)
  *B60R 16/03* (2006.01)
  *G01R 31/00* (2006.01)
  *H02M 7/00* (2006.01)

(56) References Cited

U.S. PATENT DOCUMENTS

| | | | |
|---|---|---|---|
| 2006/0255793 A1 | 11/2006 | Montreuil | |
| 2008/0048642 A1* | 2/2008 | Aratani | G01R 33/077 324/117 H |
| 2012/0032667 A1 | 2/2012 | Sakamoto et al. | |
| 2013/0271917 A1* | 10/2013 | Steger | H01L 23/473 361/699 |
| 2014/0091808 A1* | 4/2014 | Henke | G01R 31/02 324/511 |
| 2015/0245534 A1 | 8/2015 | Seo et al. | |
| 2016/0291074 A1* | 10/2016 | Baum | G01R 19/28 |
| 2017/0011985 A1* | 1/2017 | Walter | H01L 23/3675 |
| 2017/0013740 A1* | 1/2017 | Mergener | H05K 1/181 |
| 2017/0370968 A1* | 12/2017 | Okumura | G01R 15/202 |
| 2018/0348261 A1* | 12/2018 | Okamoto | G01R 15/202 |

FOREIGN PATENT DOCUMENTS

| | | |
|---|---|---|
| DE | 24 44 830 A1 | 5/1975 |
| DE | 10 2004 054 317 A1 | 5/2006 |
| DE | 10 2009 024 369 A1 | 12/2010 |
| DE | 10 2011 080 348 A1 | 2/2012 |
| DE | 10 2015 202 770 A1 | 8/2016 |
| DE | 10 2015 111 204 A1 | 1/2017 |
| EP | 2 261 973 A2 | 12/2010 |
| EP | 2 437 072 A2 | 4/2012 |
| EP | 3 236 724 A1 | 10/2017 |
| WO | 94/27157 A1 | 11/1994 |

OTHER PUBLICATIONS

"Kühlkörper", Wikipedia, https://de.wikipedia.org/w/index.php?title=K%C3%8Chlk%C3%B6rper&oldid=165590681; 6 pgs.

European Search Report dated Dec. 19, 2018, in connection with corresponding EP Application No. 18171375.1 (14 pgs., including machine-generated English translation).

Office Action dated May 26, 2020, in corresponding Chinese Application No. 201810798050.7, 17 pages.

* cited by examiner

ELECTRONICS DEVICE HAVING AT LEAST ONE COMPONENT TO BE COOLED

FIELD

The invention relates to an electronics device having at least one component to be cooled, a cooling element for cooling the component to be cooled, at least one power supply line, and a respective current sensor for recording a current strength of a current flowing through the respective power supply line. The invention further relates to a motor vehicle.

BACKGROUND

In a large number of cases of application, it is necessary to monitor currents supplied to an electronics device or currents supplied by said electronic device. For example, a monitoring and regulation of the supplied power or current strength typically needs to be conducted for traction inverters in motor vehicles. For this purpose, alternating current sensors can be utilized. As alternating current sensors, it is possible to utilize, for example, Hall sensors. In order to achieve a high sensitivity for a circuitry that is as simple as possible, open-loop Hall sensors that have a flux concentrator—for example, a ring made of soft iron guided around the line—can be utilized. In an open-loop sensor system, the Hall voltage is recorded directly.

A problem here is that appropriate Hall sensors are relatively large in construction. In addition, during operation, the components of the Hall sensor can heat up, whereby errors in measurement can occur or the measurement accuracy can decline.

Known from the publication DE 10 2004 054 317 A1 is a current measurement apparatus in which the current flows through a current channel that is arranged in such a way that it surrounds a predetermined point on a substrate. Provided at this point is a magnetic measurement element for transforming the magnetic flux to a voltage. The current channel is applied in layers onto a substrate with high thermal conductivity, on the back side of which a thermally dissipating cooling element is arranged. A drawback in this procedure is that a relatively large structural space is still required for current measurement. In addition, it is not possible to utilize standard components for current measurement, as a result of which, ultimately, higher costs and a greater complexity ensue for the electronics device.

SUMMARY

Accordingly, the invention is based on the object of presenting a space-saving possibility for measuring a current strength in an electronics device, which, in particular, can be implemented with little technical complexity.

The object is achieved in accordance with the invention by an electronics device of the kind mentioned in the introduction, wherein the cooling element has a recess, in which the current sensor engages or in which the current sensor is arranged.

In accordance with the invention, it is thus proposed to integrate a current sensor at least in part in a cooling element that is already provided in the electronics device. Through said at least partial accommodation of the current sensor in the cooling element, it is possible to save on structural space. At the same time, this results in a cooling of the current sensor, whereby the structural size of the current sensor can potentially be reduced further and/or its measurement sensitivity can increase.

The cooling element can be, for example, a cooling plate, which can serve to cool electrical semiconductor switches or other heat-producing components of the electronics device. The cooling plate can be, for example, a metal plate, which, on account of its high thermal conductivity, increases the surface for thermal radiation. However, it is also possible for the cooling element or the cooling plate to comprise an active cooling, For example, the cooling element or the cooling plate can be perforated by cooling channels, through which a cooling fluid flows.

The current sensor can be designed as a prefabricated module, which, in particular, is fastened to the cooling plate via a housing of the current sensor. The current sensor can be screwed to, riveted to, locked in place at, or adhesively attached to the cooling element. The current sensor can be, in particular, an alternating current sensor. For example, a Hall sensor with a flux concentrator can be utilized. The current sensor can supply, in particular, a voltage that depends on the measured current strength. Said current strength can be recorded, in particular by use of an analog-to-digital converter, through a control device.

The electronics device can be an electronics module that has at least one defined terminal for connection to additional components. The components of the electronics module can be arranged, in particular, inside of a housing. In particular, the recess of the cooling element can be a perforation.

The power supply line can serve for supplying power to the electronics device or, via said power supply line, energy can be supplied by the electronics device to another component. If the electronics device is, for example, a current converter, then the current can be measured at one output line or at a plurality of output lines. Alternatively or additionally, however, it is also possible for the power supply line to connect a plurality of components of the electronics device to one another.

Preferably, the power supply line is guided through a recess of the current sensor. The current measurement can, in particular, be contact-free. The recess can be surrounded, at least in portions thereof, by a flux concentrator of the current sensor—for example, by an open soft-iron ring. The recess can pass, in particular, through a housing of the current sensor. The power supply line can terminate, at least at one end, with an open contact region, which serves for connecting a connection means. For example, the power supply line can terminate in a plug or a bushing.

The recess of the cooling element can be a perforation through which the power supply line passes. In particular, the current sensor can be arranged in the perforation and the power supply line can be guided through the current sensor. By guiding the power supply line through the perforation, it is possible to achieve a cooling of the power supply line, in particular in the region of the current sensor. In this way, it may be possible to use a power supply line that has a smaller line cross section, at least in the region of the current sensor, than would be required for a line that is not cooled. When a smaller line cross section is utilized, however, it is possible to utilize, at the same time, a flux concentrator with a smaller internal diameter, as a result of which a smaller structure for a current sensor can be realized overall.

It is possible for a plurality of current sensors to be arranged jointly in the recess of the cooling element. The current sensors can be arranged, in particular, in a common housing. In this way, the electronics device can be constructed more simply. If a plurality of current sensors are arranged jointly in a perforation, with the power supply lines each being guided through the current sensors, then it is possible, in particular, through contact regions of the power supply lines at one side of the cooling element, to form a connecting element, for example, a plug or a bushing, for all power supply lines. In this way, a connection of a plurality of power supply lines can be implemented in a simple manner.

A housing that has one current sensor or a plurality of current sensors can be formed in such a way that it is guided through or is held in the recess of the cooling element. If the recess is a perforation, then the housing can have a supporting portion, which projects over the perforation, so that, after insertion in the perforation, the housing rests with the supporting portion on the cooling element. In this way, an especially simple mounting of the current sensor or of the current sensors is achieved. The supporting portion can have a recess or perforation in order to insert, for example, a screw or a rivet, with which the current sensor is fastened at the cooling element.

The current sensor can have a flux concentration element that surrounds the power supply line and, in the circumferential direction, has an opening in which a Hall sensor is arranged. The flux concentration element can have, for example, an open ring shape or a C shape. Hall sensors with flux concentrators are in principle known in the prior art and shall not be explained in detail. In a Hall sensor, at least for open-loop measurements, a fixed current is applied to the Hall sensor, and a voltage drop essentially perpendicular to it is measured. Because a clear relation exists between the induced field and a supplied current strength and a voltage drop at a Hall sensor and a field passing through the Hall sensor, it is accordingly possible to measure a current strength in the power supply line in a contact-free manner. The relation between a voltage drop at the Hall sensor and the current strength can be assumed to be approximately linear. However, it is also possible to measure this relation in advance and, for example, to file the results as a table of values in a control device that records the measurement data of the Hall sensor.

The flux concentration element can be made, for example, of soft iron or another paramagnetic or soft magnetic material. The flux concentration element and/or the Hall sensor can lie, at least partially and preferably completely, within the recess of the cooling element. Through a cooling of the Hall sensor and/or of the flux concentration element, the sensitivity of the Hall sensor can be improved and, overall, it is possible realize a smaller structure for a current sensor.

The electronics device can be a rectifier or can comprise a rectifier. It can be, in particular, an inverter, in particular for an electric motor, such as, for example, a drive motor of a motor vehicle.

The component to be cooled or at least one of the components to be cooled can be a semiconductor switch. The semiconductor switch can be a transistor, such as, for example, an IGBT or a Mosfet. Circuits for converting currents by use of semiconductor switches are known in the prior art and therefore shall not be explained in detail. In comparison to relays, for example, semiconductor switches permit markedly shorter switching intervals. In the meantime, it has been possible to create semiconductor switches that, for a closed switch, have a very low resistance. Nonetheless, in particular when heavy currents are rectified, such as is required for drive motors, a certain power loss at the semiconductor switch occurs, whereby corresponding circuits are typically cooled. A cooling element required for this can be utilized in the electronics device according to the invention, at the same time, for accommodating and for cooling the current sensor.

The cooling element can be composed of metal, at least in the region of the recess. A cooling element made of metal, in particular a cooling plate, has a good thermal conductivity and, accordingly, can serve to increase a surface over which heat can be radiated. As already explained, it can be advantageous to provide, in addition, an active cooling, wherein, for example, cooling fluid can be conveyed through cooling channels of the cooling element. The formation of the cooling element from metal, at least in regions thereof, improves the electromagnetic shielding of the current sensor against external influences. This can serve for the purpose of further increasing the measurement accuracy. Alternatively or additionally, on account of the improved electromagnetic shielding, it is also possible to achieve a smaller structure for the current sensor.

In addition to the electronics device according to the invention, the invention relates to a motor vehicle that comprises an electronics device according to the invention. The electronics device can be used, in particular, as an inverter for a motor of the motor vehicle and especially for a drive motor of the motor vehicle.

Preferably, the motor vehicle comprises a control device, by which the power supplied to the motor is regulated, wherein at least one of the current sensors records a current supplied to the motor, wherein a sensor signal of said sensor can be utilized as an input parameter of a power regulation. The regulation can adjust the current to a desired value, for example, by a pulse-width control of the semiconductor switches utilized for the inversion.

BRIEF DESCRIPTION OF THE DRAWINGS

Further advantages and details of the invention ensue from the following exemplary embodiments as well as from the associated drawings. Shown schematically herein are.

DETAILED DESCRIPTION

Figure 1:
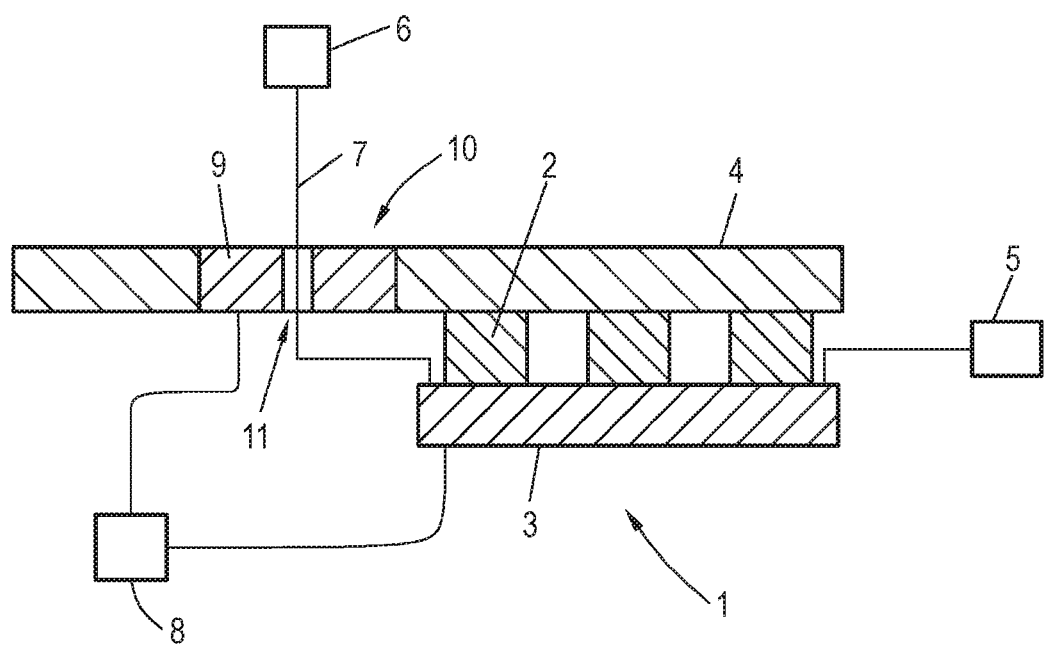
FIG. 1 an exemplary embodiment of an electronics device according to the invention.

FIG. 1 shows an electronics device 1 having a plurality of components 2 to be cooled, which are arranged on a printed circuit board 3 and are cooled by a cooling device 4. In the example shown, the electronics device 1 is an inverter, which converts a direct current supplied by a battery 5 and supplies an alternating current to a motor 6. The motor 6 can be, for example, a drive motor of a motor vehicle. The supply of alternating current is made via a power supply line 7. For clearer illustration in FIG. 1, only one power supply line 7 is illustrated. As will be explained further below, however, it is possible to use preferably a plurality of power supply lines 7 for supplying current to the motor 6 in order to supply a three-phase current to the motor 6.

The components 2 to be cooled can be, in particular, semiconductor switches, which are utilized for converting the current. For this purpose, corresponding switching signals or pulse widths and phasings can be specified by a control device 8. The cooling element 4 can be a cooling plate, which, for example, can be formed as a metal plate. Optionally, cooling channels could be provided in the cooling element 4, through which a cooling fluid can be fed in order to further improve the cooling of the components 2 to be cooled.

In order to regulate the current supplied via the power supply line 7 to a desired value, an actual value of the current needs to be determined by the control device 8. For this purpose, the electronics device 1 has a current sensor 9, which is arranged in a recess 10, namely, a perforation, of the cooling element 4. The structure of the current sensor 9 will be explained later in further detail with reference to FIGS. 2 and 3. The current sensor 9 is formed by a flux concentrator, which surrounds the power supply line 7 and has a perforation in which a Hall sensor is arranged. If, by use of such a Hall sensor, a fixed current is guided via two contacts, then a voltage can be tapped via two additional contacts, said voltage being proportional to the current flowing through the power supply line 7. Nonlinearity of said sensor can be compensated for by prior calibration, for which purpose a look-up table can be filed in the control 8, for example.

The current cable 7 is guided through a recess 11, namely, a perforation, of the current sensor 9 in order to make possible a contact-free measurement of the current.

The structure of the electronics device 1 that is shown makes possible, through the arrangement of the current sensor 9 in the cooling device 4, an integration of a current measurement with a small use of structural space. Because, in addition, both the current sensor 9 and the power supply line 7 can be cooled as well in the region of the current sensor 9 by the cooling element 4, the measurement accuracy of the current sensor 9 can be improved and the cross section of the power supply line 7 can be decreased, as a result of which the utilization of a more compact current sensor 9 is also made possible.

Figure 2:
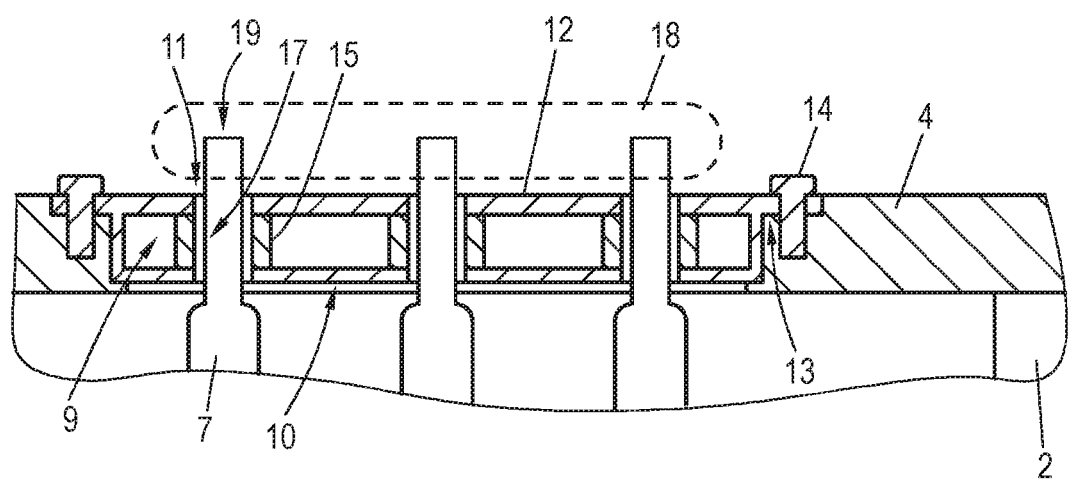
FIG. 2 detailed view of another exemplary embodiment of an electronics device.
Figure 3:
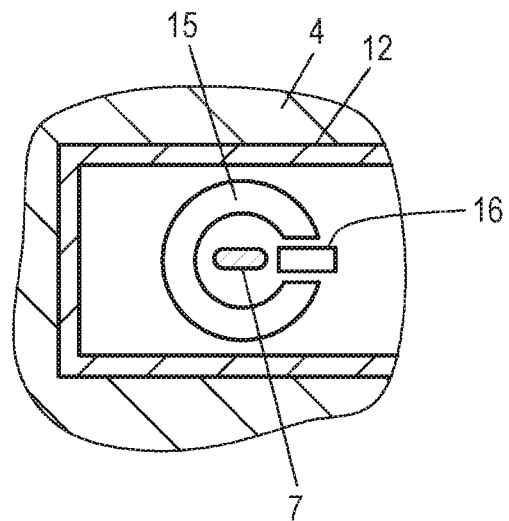
FIG. 3 detailed view of another exemplary embodiment of an electronics device.

FIGS. 2 and 3 show detailed views of another exemplary embodiment of an electronics device. The structure corresponds substantially to the device shown FIG. 1, wherein, instead of one power supply line 7, three power supply lines 7 are used in order to supply three phases of an alternating current to a external device, such as, for example, the motor 6. Elements that have already been discussed in reference to FIG. 1 are identified here using identical reference numbers.

Three current sensors 9 for the three power supply lines 7 are arranged in the recess 10 of the cooling element 4. Said power supply lines are fastened to the cooling element 4 by way of a common housing 12. The housing 12 can be inserted from above into the recess 10 in FIG. 2 and rests with its supporting portions 13 on the edge of the recess 10. Said supporting portions have perforations for fastening the housing 10 and thus the current sensors 9 to the cooling element 4 with fastening elements 14, for example, with screws.

The individual current sensors 9 are formed by a flux concentration element 15, which surrounds the power supply line 7, and a Hall sensor 16, wherein the flux concentration element 15 has an opening in the circumferential direction, in which the Hall sensor 16 is arranged. For reasons of clarity, the wiring of the Hall sensor 16 is not illustrated. The portions 17 of the power supply lines 7 in which they traverse the cooling element 4 and the current sensor 9 have a narrowed cross section. This is made possible in that, in said portion 17, each power supply line 7 is cooled by the cooling element 4, as a result of which the current-carrying capacity is improved. This also makes it possible for the recess 11 of the current sensor 9 or of the flux concentration element 15 to have a smaller diameter than would otherwise be required, as a result of which, overall, the current sensor 9 can be constructed to be more compact.

The power supply lines 7 have, at one end, open contacts 19, through which a plug 18 is formed in the region of the cooling element. At said open contacts, the motor 6 can be connected via a corresponding connecting element, for example.

If the cooling element 4 is formed from metal at least in the region of the recess 10, then the cooling element 4 can serve, at the same time, for electromagnetic shielding of the current sensor 9, as a result of which the measurement accuracy thereof can be improved.

Figure 4:
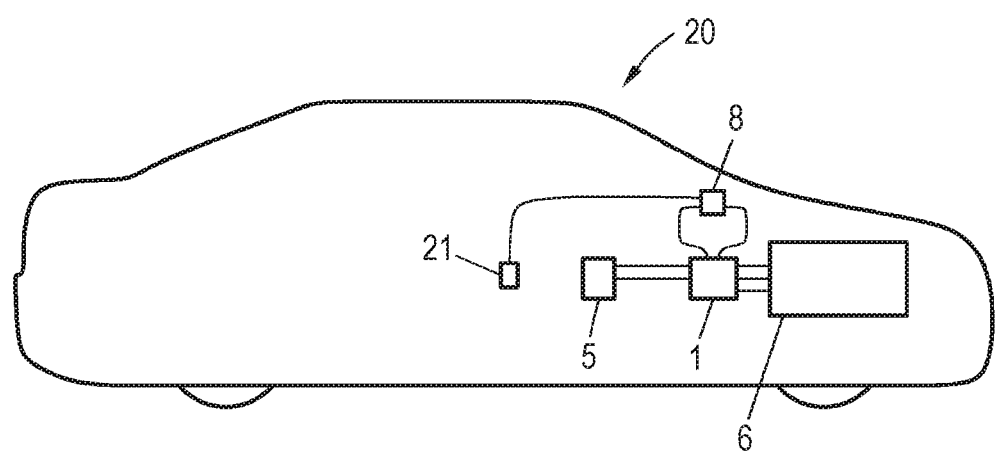
FIG. 4 an exemplary embodiment of a motor vehicle according to the invention.

FIG. 4 shows a motor vehicle 20, which has, as a motor 6, an electronic drive motor, which is supplied through the battery 5, such as, for example, a high-voltage battery. In order to convert the direct current supplied by the battery 5 to a three-phase alternating current, an electronics device 1 is provided, which is constructed as explained in reference to FIG. 1, wherein, as explained in reference to FIGS. 2 and 3, separate power supply lines 7 are used for the individual phases of the alternating current. Data of a large number of vehicle devices 21 are acquired by the control device 8—for example, data from an accelerator pedal sensor—in order to specify a desired power for the motor 6. In order to set said desired power, the control device 8 records, on the one hand, the instantaneously supplied current strength via the current sensors 9 of the electronics device 1, and, on the other hand, specifies pulse widths for the semiconductor switches of the electronics device in order to adjust the actually delivered current strength to the desired current strength.

The invention claimed is:

1. An electronics device having at least one component to be cooled, at least one power supply line, a respective current sensor for recording a current strength of a current flowing through the respective power supply line, and a cooling element for cooling the at least one component to be cooled,
    wherein the at least one component to be cooled includes the at least one power supply line and the respective current sensor,
    wherein in that the cooling element has a recess, in which the current sensor engages or in which the current sensor is arranged so that the current sensor measures the current strength in a contact-free manner,
    wherein the at least one component to be cooled further includes a semiconductor switch on a circuit board, and the semiconductor switch is located between the cooling element and the circuit board, and
    wherein the respective current sensor is arranged in a common housing, and the common housing is inserted into the recess of the cooling element and rests with at least one supporting portion on an edge of the recess,
    wherein the recess into which the common housing is inserted is a perforation of the cooling element,
    wherein, once inserted into the recess, an exterior surface of the common housing is co-planar with a surface of the cooling element which lies outside of the recess.

2. The electronics device according to claim 1, wherein the power supply line is guided through a recess of the current sensor.

3. The electronics device according to claim 1, wherein the power supply line is guided through the perforation of the cooling element.

4. The electronics device according to claim 1, wherein a plurality of the current sensors are arranged jointly in the recess of the cooling element.

5. The electronics device according to claim 1, wherein that the electronics device comprises a rectifier.

6. The electronics device according to claim 1, wherein the cooling element is composed of metal, at least in the region of the recess.

* * * * *